(12) United States Patent
Starkey

(10) Patent No.: US 6,989,412 B2
(45) Date of Patent: *Jan. 24, 2006

(54) EPOXY MOLDING COMPOUNDS CONTAINING PHOSPHOR AND PROCESS FOR PREPARING SUCH COMPOSITIONS

(75) Inventor: Dale Starkey, Olean, NY (US)

(73) Assignee: Henkel Corporation, Rocky Hill, CT (US)

( * ) Notice: Subject to any disclaimer, the term of this patent is extended or adjusted under 35 U.S.C. 154(b) by 690 days.

This patent is subject to a terminal disclaimer.

(21) Appl. No.: 09/875,323

(22) Filed: Jun. 6, 2001

(65) Prior Publication Data

US 2003/0001140 A1  Jan. 2, 2003

(51) Int. Cl.
C08K 3/08 (2006.01)
C08L 63/00 (2006.01)

(52) U.S. Cl. ............... 523/458; 523/459; 525/508; 525/533

(58) Field of Classification Search ............ 523/457, 523/458, 459; 525/508, 533
See application file for complete search history.

(56) References Cited

U.S. PATENT DOCUMENTS

| | | | |
|---|---|---|---|
| 3,849,383 A | 11/1974 | Fetscher et al. | 260/75 N |
| 4,288,264 A | 9/1981 | Haque | 156/67 |
| 4,298,650 A | 11/1981 | Lu | 428/306 |
| 4,362,946 A | 12/1982 | Cusano et al. | 250/483 |
| 4,485,200 A | 11/1984 | Perlinski et al. | 523/409 |
| 4,532,395 A | 7/1985 | Zukowski | 200/314 |
| 4,534,743 A | 8/1985 | D'Onofrio et al. | 445/24 |
| 4,551,488 A | 11/1985 | Leech et al. | 523/427 |
| 4,814,227 A | 3/1989 | Maeda et al. | 428/353 |
| 4,900,641 A | 2/1990 | Kohda et al. | 428/690 |
| 4,943,606 A | 7/1990 | Inoue et al. | 523/457 |
| 5,076,963 A | 12/1991 | Kameyama et al. | 252/301.36 |
| 5,149,971 A | 9/1992 | McElhaney et al. | 250/361 |
| 5,454,892 A | 10/1995 | Kardon et al. | 156/67 |
| 5,521,236 A | 5/1996 | Moy et al. | 524/101 |
| 5,624,979 A | 4/1997 | Kleiner et al. | 523/453 |
| 5,646,412 A | 7/1997 | Bryan et al. | 250/483.1 |
| 5,813,753 A | 9/1998 | Vriens et al. | 362/293 |
| 5,886,401 A | 3/1999 | Liu | 257/678 |
| 5,956,382 A | 9/1999 | Wiener-Avnear et al. | 378/98.8 |
| 5,973,034 A | 10/1999 | Mori et al. | 523/458 |
| 6,245,259 B1 | 6/2001 | Hohn et al. | 252/301.36 |
| 6,246,123 B1 * | 6/2001 | Landers et al. | 257/787 |
| 6,376,101 B1 | 4/2002 | Ota | 428/620 |
| 6,396,066 B1 | 5/2002 | Chen et al. | 250/488.1 |
| 6,501,102 B2 | 12/2002 | Mueller-Mach et al. | 257/84 |
| 6,518,600 B1 * | 2/2003 | Shaddock | 257/98 |
| 6,555,023 B2 | 4/2003 | Smith | 252/401 |
| 6,592,780 B2 | 7/2003 | Höhn et al. | 252/301.36 |
| 6,593,011 B2 | 7/2003 | Liu et al. | 428/690 |
| 6,603,258 B1 | 8/2003 | Mueller-Mach et al. | 313/501 |
| 6,603,259 B1 | 8/2003 | Kiryuschev et al. | 313/505 |
| 6,613,247 B1 | 9/2003 | Höhn et al. | 252/301.36 |
| 6,617,401 B2 * | 9/2003 | Rubinsztajn | 525/533 |
| 6,632,892 B2 * | 10/2003 | Rubinsztajn et al. | 525/476 |
| 6,713,571 B2 * | 3/2004 | Shimada | 525/526 |
| 2001/0028053 A1 | 10/2001 | Hohn et al. | 252/301.36 |
| 2001/0030326 A1 | 10/2001 | Reeh et al. | 257/98 |
| 2001/0046601 A1 | 11/2001 | Peruzzotti et al. | 428/375 |
| 2003/0001140 A1 | 1/2003 | Starkey | 252/301.35 |
| 2003/0071568 A1 | 4/2003 | Lowery et al. | 313/512 |
| 2003/0099859 A1 | 5/2003 | Liu et al. | 428/690 |
| 2003/0173540 A1 | 9/2003 | Mortz et al. | 252/301.36 |
| 2003/0178632 A1 | 9/2003 | Hohn et al. | 257/99 |
| 2004/0063840 A1 * | 4/2004 | Starkey | 524/442 |

FOREIGN PATENT DOCUMENTS

| | | |
|---|---|---|
| JP | 52015539 | 5/1977 |
| JP | 63100391 | 9/1988 |

OTHER PUBLICATIONS

Derwent accession No. 1977-19192Y for Japanese Patent No. 52-15539, Feb. 5, 1977, Nakano.*

* cited by examiner

*Primary Examiner*—Robert Sellers
(74) *Attorney, Agent, or Firm*—Steven C. Bauman

(57) ABSTRACT

A molding compound for use in encapsulating electronic packages which include an optoelectronic component, such as an LED, is provided. The molding compound of the present invention includes a partially cured epoxy composition having a phosphor material substantially uniformly distributed throughout the epoxy composition. The phosphor material may be suspended within the epoxy composition by pre-reacting a portion of the epoxy composition prior to B-staging of the molding compound. As such, the phosphor material is suspended within the epoxy composition, thereby preventing settling of the phosphor material during B-staging, as well as during curing of the molding compound in the encapsulation process.

13 Claims, 1 Drawing Sheet

EPOXY MOLDING COMPOUNDS CONTAINING PHOSPHOR AND PROCESS FOR PREPARING SUCH COMPOSITIONS

BACKGROUND OF THE INVENTION

1. Field of the Invention

The present invention relates to epoxy molding compositions. More particularly, the present invention relates to epoxy molding compositions which are particularly useful as optoelectronic encapsulants for light emitting devices.

2. Brief Description of Related Technology

Epoxy resin compositions are widely used for electronic packaging materials in the electronics industry, and, in particular, as encapsulants for semiconductor elements and electronic circuits. Accordingly, epoxy resin based compositions have been widely used in the formation of molding compositions for use as electronic packaging materials. Transparent epoxy molding compositions are well known for use as encapsulants in connection with optoelectronic devices, such as light-emitting diodes (LEDs), for use for lighting applications in the electronics industry.

LEDs have traditionally been multilayer epitaxial structures based mainly on AlGaAs and InGaAlP as basic materials. Such LEDs are typically encapsulated in a transparent epoxy composition, which is typically provided in a dome shape for efficient transmission of light from the LED.

Epoxy compositions useful in encapsulating optoelectronic devices such as LEDs may involve liquid type compositions, which can be filled or poured about an LED and cured. Additionally, partially cured epoxy compositions may be used for encapsulating LEDs, in which an epoxy composition is partially cured or "B-staged" to form a "pellet", which can then be transfer molded with the electronic device under heat and pressure to encapsulate the LED.

More recently, GaN (gallium nitride)-based semiconductor devices have been used in UV/blue lasers and UV/blue LEDs. UV/blue LEDs are LEDs which are capable of emitting in the ultraviolet (UV) range, or in the blue range, or in both the UV and blue ranges of the electromagnetic spectrum. Conversion of UV/blue light from an LED to visible white light can be accomplished using phosphors, which are typically applied to the surface of the LED and then encapsulated with an epoxy encapsulant.

U.S. Pat. No. 5,886,401 to Liu discloses an LED structure including a transparent epoxy compound for encapsulating the LED, and including a phosphor layer coated on the outer surface of the epoxy compound. Such an arrangement requires additional manufacturing steps for providing the separate layers of epoxy and phosphor, which results in additional time and cost for manufacturing.

U.S. Pat. No. 5,149,971 to McElhaney et al. discloses a scintillator assembly which includes a body of optically-transparent epoxy and an amount of phosphor particles embedded within the body adjacent one surface. The phosphor particles are mixed within the liquid epoxy when in an uncured state and settle to the bottom surface of a mold in which the liquid epoxy is contained. Upon curing into a hardened body, the phosphor particles are coated on one surface thereof.

U.S. Pat. No. 5,813,753 to Vriens et al. discloses an LED for use in lighting applications which includes a UV/blue LED located in a depression of a cup, with the cup being filled with a light transmitting cycloaliphatic epoxy encapsulant with phosphor particles dispersed in the encapsulant or adhered to the surface of the LED. Such cycloaliphatic epoxy encapsulants are well known for use as liquid epoxy compositions in encapsulating electronics. Such liquid cycloaliphatic epoxy compositions, however, cannot be B-staged due to their inherent high reactivity. Moreover, because of their low viscosity, the phosphor particles typically settle out of the liquid composition during curing, thereby providing a non-uniform distribution of phosphor throughout the cured encapsulant.

Accordingly, it would be advantageous to provide a molding composition useful as an optoelectronic encapsulant for LEDs which provides for substantially uniform distribution of phosphors and which is easy to manufacture and use as a molding composition.

SUMMARY OF THE INVENTION

The present invention is directed to a molding compound which includes an epoxy composition including the reaction product of an epoxy component and an anhydride component; and a visible light-emitting phosphor material, with the phosphor material substantially uniformly distributed throughout the molding compound.

In a further embodiment, the present invention is directed to an encapsulant material for an electronic component, such as an LED, which includes a molding compound which is a reaction product of a partially cured epoxy composition having a phosphor material substantially uniformly distributed therethrough. The molding compound has an average molecular weight of about 5,000 to about 20,000. Desirably, the molding compound is prepared by B-staging a partially cured homogeneous mixture of the epoxy composition and the phosphor material which has been previously subjected to partial curing to increase the viscosity of the epoxy composition and suspend the phosphor material within the epoxy composition during mixing of the homogeneous mixture.

A further embodiment of the present invention is directed to a method of preparing a molding compound, which includes providing an epoxy composition including an epoxy compound, and mixing a visible light-emitting phosphor material with the epoxy composition to provide a homogeneous mixture, with the phosphor material suspended within the epoxy composition. The viscosity of the homogeneous mixture is increased while maintaining the phosphor material suspended within the epoxy composition to form a pre-reacted intermediate. This can be accomplished by partially curing the epoxy composition to an initial viscosity capable of maintaining the phosphor material suspended within the epoxy composition. The pre-reacted intermediate is then B-staged to partially cure the epoxy composition, thereby forming the molding compound.

A further embodiment of the present invention involves a method of preparing a molding compound which includes providing an epoxy composition including an epoxy compound and an anhydride, and mixing a visible light-emitting phosphor material with the epoxy composition at a temperature of about 105° C. to about 110° C. to provide a homogeneous mixture, with the phosphor material suspended within the epoxy composition. The mixture is cooled to a temperature of about 60° C. to about 65° C., and a polyol is added to the mixture for reaction with the anhydride. The temperature of the mixture is then increased to about 70° C. to about 80° C. for a time period of about 10 minutes to 30 minutes to cause an increase in the viscosity of the mixture while maintaining the phosphor material suspended within the epoxy composition to form a pre-reacted intermediate. The pre-reacted intermediate is then B-staged at a temperature of about 65° C., thereby forming the molding compound with the phosphor material uniformly distributed therethrough.

Still further, the present invention is directed to a method of encapsulating an optoelectronic device, which includes providing an optoelectronic device and a molding compound which includes a light-emitting phosphor material homogeneously mixed within a partially cured epoxy compound, and encapsulating the optoelectronic device with the molding compound, followed by fully curing the epoxy compound.

In yet a further embodiment, the present invention includes an optoelectronic device including an LED and an encapsulant surrounding the LED, with the encapsulant in the form of a reaction product of a cured epoxy composition having a phosphor material substantially uniformly distributed therethrough.

DETAILED DESCRIPTION OF THE INVENTION

Figure 1:
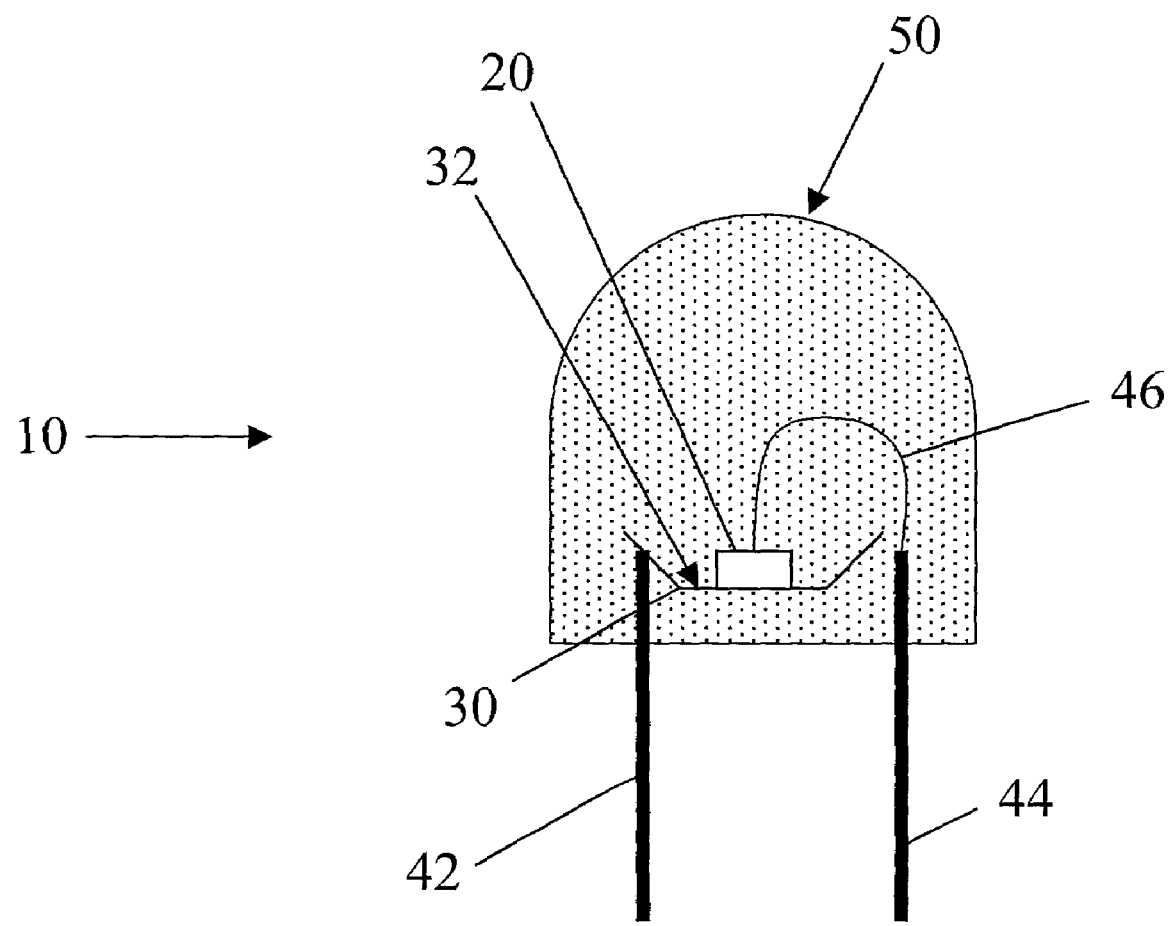
FIG. 1 is a schematic diagram of an optoelectronic device in accordance with the present invention.

The present invention is directed to a composition of matter, and, in particular, to a molding compound such as for use in encapsulating electronic packages which include an optoelectronic component such as an LED. The molding compound of the present invention includes a partially cured epoxy composition having a phosphor material uniformly distributed throughout the epoxy composition. By providing the phosphor material within the partially cured epoxy composition, the phosphor material can be suspended within and substantially uniformly distributed throughout the epoxy composition, thereby preventing settling of the phosphor material during curing thereof in the encapsulation process.

As noted, the molding compound of the present invention includes an epoxy composition. The epoxy composition is a substantially transparent epoxy composition capable of transmitting light emitted from an LED, as is known in the art. In desirable applications, the epoxy composition used in the molding compound of the present invention is a reaction product of an anhydride of a cyclic dibasic acid and an epoxy-containing compound.

The cyclic anhydride component used in the present invention is desirably a cycloaliphatic anhydride, such as hexahydrophthalic anhydride (HHPA). Small quantities of other related anhydrides, such as tetrahydrophthalic anhydride and phthalic anhydride, may be present with the hexahydrophthalic anhydride but should not be more than 25% of the total cyclic acid anhydride content, e.g., 5 to 25%, for best results.

As the epoxy component, any thermosetting epoxy resin may be used which is capable of being B-staged, as will be discussed in more detail herein. Particularly desirable are solid epoxy resins, and in particular, tri- or multi-functional epoxy resins. Non-limiting examples of useful epoxy resins include solid epoxy resins derived from bisphenol A or F, tetramethyl and/or biphenyl, and epichlorohydrin, novalacs, and the like. Triglycidyl isocyanurate (TGIC) is particularly desirable. An example of a particularly useful product is tris(2,3-epoxy-propyl) isocyanurate, sold under the tradename TEPIC® by Nissan Chemical Industries, Ltd.

In order to promote reaction of the cyclic anhydride component and the epoxy component, the anhydride ring must be opened. Various agents can be incorporated into the epoxy composition to assist in this ring opening reaction. Such ring opening can be accomplished, for example, by active hydrogens present as water, or by hydroxyls, or by a Lewis base. In desirable applications, a polyol is incorporated into the epoxy composition to assist in the ring opening of the anhydride and promote curing of the epoxy composition. The polyol should be a lower aliphatic polyol of 3 to 6 carbon atoms and 2 to 4 hydroxyls, preferably of 3 hydroxyls, although in some cases minor proportions of other polyols may be blended in, providing that they do not adversely affect the molding compound properties. The highly preferred polyols employed are glycerol and trimethylol propane (TMP), alone or in mixture. Other polyols of the group described may be utilized in minor proportions, generally being less than 25%, e.g., 5 to 25%, of the polyol content. Among these are ethylene glycol, diethylene glycol, propylene glycol and dipropylene glycol. A suitable substitute material for these or for part of them is propoxylated pentaerythritol, a tetrol having a molecular weight of about 400, sold under the name PeP-450. This propoxylated pentaerythritol may be used in small quantities, generally being limited to 5 to 25% of the polyol content, preferably on a hydroxyl content basis. In the selection of the "supplementing" polyols, it will often be most desirable to employ those which are liquid at room temperature or with heating to comparatively low temperatures. However, comparatively high melting materials, e.g., pentaerythritol, may be employed, preferably as a small proportion of polyol component.

The various reactants will be essentially pure, over 95% pure, preferably over 99% pure, and most preferably 99.9 to 100% pure. Of course, they should be clean and colorless and water content is to be avoided.

Although the reactions to make the molding compounds and subsequently to cure them may be effected without a catalyst, sometimes, in order to speed the reaction, the presence of a catalyst may be useful. It has been found that a relatively small group of catalytic materials, tin soaps of fatty acids of 8 to 18 carbon atoms, exert a catalytic effort without impairing the clarity, colorless nature, and other desirable properties of the molding compound and the finished cured product.

Other than the acid anhydride and epoxy-containing reactants, along with the polyol for ring opening and optionally with the tin soap catalyst, the presence of large proportions of other materials in the epoxy composition of the molding compound is avoided, so as to assure maintenance of the clarity and other properties of the cured polymer. Minor proportions of adjuvants which have specific desirable effects are acceptable. For example, mold release agents may be employed. Among the mold releases, higher fatty acids of 12 to 20 carbon atoms, or lower alcohol (1 to 3 carbon atoms) esters thereof, preferably saturated, and most preferably stearic acid or methyl stearate, are utilized because they are very effective in easily releasing the product from the mold.

As noted above, in addition to the epoxy composition, the molding compounds of the present invention further include a phosphor material evenly distributed therethrough. The phosphor material is capable of converting light which is emitted from an LED into visible white light. The phosphor material can be a phosphor which is capable of converting and emitting one color (broadband, narrow band or multiline, e.g., red, green, blue, yellow, or white), or a mixture of phosphors which are capable of converting and emitting different colors to get a good color rendering. In particularly desirable applications, the molding compound of the present invention is provided for use with an LED capable of transmitting UV and/or blue light, and the phosphor material is capable of converting such UV and/or blue light into visible white light, in particular, light having a wavelength in the known visible white light range, such as about 400 to about 800 nm. The phosphor material is desirably provided in the form of particles or grains, which can be intermixed within the epoxy composition, as will be described in more detail herein.

As noted, the phosphor material may be selected from any known phosphor which, in combination with a UV or blue LED, will produce the desired light emission. For example, as is known in the art, yellow phosphor with a blue LED can be used to produce white light. An example of a particularly desirable phosphor is Yttrium Aluminum Garnet ("YAG") yellow phosphor, which has a peak emission of about 575 nm. Such a phosphor is particularly useful for producing visible white light in combination with InGaN blue LED, which has a peak emission at 465 nm.

The proportions of the various components of the molding compounds employed are such as to produce the monoester of the acid anhydride and have the glycidyl moiety of the triglycidyl isocyanurate react with the acid group resulting from the anhydride-polyol reaction. Of course, in the present reactions, it is possible that a molecule of polyol may react with both carboxyls which may be considered to have come from the anhydride, or polyol hydroxyls from different polyol molecules may each react with the carboxyls. Similarly, more than one glycidyl moiety of the triglycidyl isocyanurate may react with anhydride carboxyls and, in some cases, such reactions may be effected before the anhydride reacts with polyol. However, in most instances, the reactions may be considered to be those as initially described, with a polyol forming a monoester with an acid anhydride and a glycidyl moiety of triglycidyl isocyanurate reacting with a free carboxylic acid group generated by the previous reaction. Such reactions may be considered to be effected when the three reactants are simultaneously reacted.

Desirably, the molding compound includes from about 20 weight percent to about 75 weight percent of the epoxy-containing compound based on the total weight of the molding compound, more desirably from about 30 weight percent to about 40 weight percent of the epoxy-containing compound based on the total weight of the molding compound; from about 20 weight percent to about 75 weight percent of the acid anhydride based on the total weight of the molding compound, more desirably from about 45 weight percent to about 55 weight percent of the acid anhydride based on the total weight of the molding compound; from about 5 weight percent to about 20 weight percent of the polyol based on the total weight of the molding compound, more desirably from about 5 weight percent to about 10 weight percent of the polyol based on the total weight of the molding compound; and from about 0.5 weight percent to about 20 weight percent of the phosphor material based on the total weight of the molding compound, desirably from about 5 weight percent to about 12 weight percent of the phosphor material based on the total weight of the molding compound. In addition, when a mold release agent is incorporated into the molding compound, such a mold release is desirably provided in an amount of from about 0.1 weight percent to about 2 weight percent based on the total weight of the composition.

As noted, the phosphor material is substantially uniformly distributed throughout the molding compound. Such a uniform distribution of the phosphor material is important to prevent settling of the phosphor material during curing of the encapsulant over the optoelectronic component, which can result in inconsistent levels of light emitted through the encapsulant. Providing the phosphor material uniformly distributed throughout a molding compound, however, can be difficult due to settling of the phosphor material, which can occur during final cure of the molding compound, or, in the case of pre-formed molding compounds, during B-stage curing of the molding compound. Such settling is believed to be due to the high specific gravity associated with such phosphor materials, as well as the low viscosity of a typical epoxy composition for use in a molding compound.

It has been discovered through the present invention that the phospor material can be substantially uniformly distributed throughout the epoxy composition, and maintained with such a uniform distribution, by increasing the viscosity of the epoxy composition while maintaining the phosphor material uniformly distributed throughout the epoxy composition, such as through continued mixing, thus suspending the phosphor material within the epoxy composition to form a pre-reacted intermediate. As such, the molding compound is provided as a reaction product of such a pre-reacted intermediate.

More particularly, preparation of the molding compound of the present invention involves a pre-mixing of the epoxy composition with the phosphor material to provide a homogeneous mixture, wherein the phosphor material is substantially evenly distributed within the epoxy composition. This may be accomplished by combining and mixing the epoxy compound, the anhydride component, and the phosphor material. Desirably, such mixing occurs at a temperature of from about 80° C. to about 140° C., more desirably from about 105° C. to about 110° C., for a period of about 20 minutes. No significant reaction occurs during this mixing step.

The thus prepared mixture is cooled to a temperature of about 45° C. to about 85° C., desirably 60° C. to about 65° C. The polyol is then added to the mixture thus prepared with continued mixing, for example, through the use of a mixing blade. Addition of the polyol is believed to initiate a reaction with the anhydride, thereby forming a half acid/half ester. The temperature of the mixture is increased to about 70° C. to about 80° C. over a period of about 10 to 30 minutes, with continued mixing of the components. During this time, the epoxy composition begins to cure, and the viscosity of the mixture slowly increases. Such an increase in viscosity due to partial curing of the epoxy composition suspends the phosphor material within the partially cured epoxy composition. During this initial partial curing, the viscosity of the composition is increased to about 300 to 900 centipoise (cps) at 75° C. As such, a pre-reacted intermediate product is formed. Desirably, this intermediate product has a weight average molecular weight of from about 300 to about 1,000.

It is noted that the viscosity of the pre-reacted intermediate is directly related to the amount of phosphor material incorporated therein, as well as the particle size and surface treatment of the phosphor material. For example, a pre-reacted intermediate product, according to the present invention, including about 12 weight percent of phosphor material based on the total weight of the composition, may achieve a viscosity of about 600 to 800 cps when heated at 75° C. for a period of 20 minutes. A similar epoxy composition without any phosphor material incorporated therein achieves a viscosity of about 400 cps under similar conditions of 75° C. heating for a period of 20 minutes. Accordingly, including the phosphor material results in achieving an increased viscosity in the composition in a shorter time period.

To form the molding compound, this intermediate product is further partially cured. Desirably, the intermediate product is transferred to cavities or molds for B-staging of the composition. B-staging of the composition helps to speed molding times during subsequent molding encapsulation procedures by polymerizing the epoxy composition at a comparatively low temperature, making it possible to produce a stable molding compound (stable for several months at room temperature) which will be satisfactorily moldable in a subsequent molding encapsulation procedure, with a short curing period. B-staging is effected at a temperature in the range of 50° C. to 100° C., more desirably 60° C. to 80° C., most desirably at about 65° C., for a period of 30 minutes to 24 hours, preferably from 4 to 10 hours, when no catalyst is used. With catalyst, the times may be from ¼ to ⅔ of those noted.

B-staging is typically continued until a spiral flow of about 30 to about 50 inches is achieved, using testing procedures well known in the art. Such B-staging results in formation of a molding compound having approximately 40 to 60% of the epoxy moieties of the epoxy compound being reacted. As such, the molding compound is sufficiently polymerized so as to be cured quickly in a subsequent molding operation. After B-staging, the resin may be size reduced to a suitable particle size range, e.g., ⅟₁₆ inch to ¼ inch diameter. Alternatively, it can be B-staged to a pre-form shape in a suitably sized mold and, after ejection from the mold, may be employed directly. In this manner, the molding compound acquires the shape of the mold, producing a stable product, such as a pellet, for later curing during an encapsulation process.

The molding compound has a weight average molecular weight of about 5,000 to about 20,000, due to the partial curing of the epoxy composition. As such, the molding compound represents a reaction product of the intermediate product, which is itself a partially cured epoxy composition having a phosphor material uniformly distributed therethrough. Moreover, since the B-staging was conducted with the pre-reacted intermediate product having the phosphor material uniformly suspended therein, the final molding composition includes the phosphor material substantially uniformly distributed throughout the molding composition.

As discussed, the molding compound of the present invention is provided in a substantially solid form, such as a pellet. Molding compositions provided in such pellet form for use, for example, in transfer press molding applications, are known in the art, and typically involve an epoxy-containing compound in which the epoxy composition has been partially reacted to form a partially cured reaction product. By incorporating the phosphor material into the molding compound within the partially reacted structure thereof, the phosphor material can be maintained evenly throughout the structure of the molding compound. Accordingly, during final curing of the molding compound during encapsulation, the phosphor material can be maintained in a substantially uniform distribution throughout the molding compound, thereby resulting in an encapsulated electronic component in which the fully cured encapsulant includes a phosphor material evenly and homogeneously distributed throughout the structure thereof.

An advantage of the present molding compounds is achieved in the ability to B-stage the molding compounds. Thus, although cycloaliphatic epoxy resins are reputed to be useful as encapsulants, they are liquids and cannot be B-staged with HHPA. Any initial reaction between the anhydride, polyol, and cycloaliphatic resin would form a cross-linked pellet which would not flow when heated, and would therefore not be useful as a molding composition for the present invention.

The present invention further provides a method for encapsulating an optoelectronic device using such a molding compound. In such a method, the optoelectronic device, such as an LED, is provided, along with a molding compound which includes a phosphor material uniformly distributed and homogeneously mixed within a partially cured epoxy composition. The LED is encapsulated with the molding compound, and the epoxy composition is fully cured.

More particularly, molding processes using the prepared molding compound may be accomplished by any known method, including utilization of pre-forms and transfer molding or compression molding, wherein the polymer is thermoset to final structure. Primarily, the present molding compounds are intended for transfer molding. After curing, the finished product is ejected from the mold and such removal may often be effected immediately, without the need for any cooling. The polymer is normally employed to cover, strengthen, rigidify and/or insulate an enclosed material and such is present in the mold during the curing operation. Molding can be accomplished in short time periods, as low as 45 seconds, and normally within the range of one to five minutes, at a temperature of about 130° C. to 175° C., preferably from 140° C. to 160° C. Molding pressures (transfer molding) may be varied widely but will normally be in the range of 300 to 2,000 lbs/sq. in.

Although the most important application of the present molding compounds relates to light emitting electronic devices, covered, stabilized, and protected by the cured compositions in operations in which pre-formed or particulate molding compounds are utilized, the polymers and molding compounds are not limited to such applications but can find more general uses as structural materials, printed circuit substrates, potting compounds, encapsulants, insulators, etc.

In a further aspect, the present invention also provides an optoelectronic device in the form of a light-emitting diode having an encapsulant surrounding the light-emitting diode. The encapsulant is a reaction product of a cured epoxy composition having a phosphor material substantially uniformly distributed therethrough, as described hereinabove. Such an optoelectronic device is depicted generally in FIG. 1.

FIG. 1 depicts an optoelectronic device 10 which includes an LED 20 encapsulated by an encapsulant 50. LED 20 may be any LED as is known in the art. For example, LED 20 may desirably be an LED stack having a multi-layer structure, with an upper ohmic contact and a lower ohmic contact, as is known in the art. LED 20 is positioned within reflector cup 30, which includes a reflective surface 32, such as a mirror. Reflector cup 30 is in electrical communication with the lower ohmic contact of LED 20.

Optoelectronic device 10 further includes lead wires 42 and 44. Lead wire 42 is in electrical communication with the lower ohmic contact of LED 20 through reflector cup 30, and lead wire 44 is in electrical communication with the upper ohmic contact of LED 20, for example through bond wire 46.

Optoelectronic device 10 further includes encapsulant 50 surrounding and encapsulating LED 20. Encapsulant 50 includes a reaction product of a cured epoxy composition having a phosphor material substantially uniformly distributed therethrough, as is described in detail hereinabove. Encapsulant 50 surrounds LED 20 and is formed in the shape of a dome, with relatively large dimensions as compared to LED 20. Encapsulant 50 may be formed about LED 20 through a transfer molding process, as is known in the art.

Activation of LED 20 through electrical current supplied by lead wires 42 and 44 causes emission of light, such as UV and/or blue light from LED 20. Such light is converted to visible light by the phosphor material within encapsulant 50. Since encapsulant 50 includes the phosphor material substantially uniformly distributed throughout the epoxy composition, the light is converted and distributed substantially uniformly through encapsulant 50, thereby providing for uniform emission of visible light from the optoelectronic device.

The present invention will be further exemplified through the following examples, which demonstrate the preparation of molding compositions of the present invention, as well as comparisons of such molding compositions with prior art compositions. Unless otherwise indicated in the examples and elsewhere in the specification and claims, all parts and percentages are by weight, temperatures are in degrees centigrade, and pressures are at or near atmospheric pressure.

EXAMPLES

Example 1

A molding composition was prepared having the following components:

TABLE 1

| COMPONENT | WEIGHT % |
| --- | --- |
| HHPA[1] | 45.24 |
| TGIC[2] | 34.55 |
| Stearic Acid | 1.00 |
| Phosphor | 12.00 |
| Glycerin | 7.21 |
| Total | 100.00 |

[1]hexahydrophthalic anhydride
[2]triglycidyl isocyanurate

The above components were mixed and the mixture was poured into a molding tray for B-staging. B-staging was accomplished by heating the mixture to a temperature of 65° C. for a time period of about 17 hours, until a spiral flow of 30 to 50 inches was achieved, using a standard test procedure as is known in the art. After B-staging, the molded compound thus formed was analyzed for phosphor content at the top, middle, and bottom portions of the compound relative to the positioning in the mold. Analysis of the molded compound determined the phosphor content to be 11.3% at the top portion, 11.4% at the middle portion, and 11.6% at the bottom portion.

Example 2

A molding composition having the same proportion of components as set forth in Example 1 was prepared. In the composition of Example 2, however, the triglycidyl isocyanurate, hexahydrophthalic anhydride and stearic acid components were mixed with the phosphor in a liquid reaction vessel at a temperature of 105° to 110° C. while stirring. The mixture was allowed to cool to about 60° C. to 65° C., and then the glycerin was added. The temperature of the mixture was increased to about 75° C. over a 20 minute period, with continuous mixing of the components using a mixing blade. After 20 minutes, the composition had a viscosity of about 750 cps at 75° C.

The mixture was then transferred into a molding tray for B-staging. B-staging was accomplished in a similar manner as in Example 1, by heating the mixture to a temperature of 65° C. for a time period of about 17 hours, until a spiral flow of 30 to 50 inches was achieved. After B-staging, the molded compound thus formed was analyzed for phosphor content at the top, middle, and bottom portions of the compound relative to the positioning in the mold. Analysis of the molded compound determined the phosphor content to be 11.9% at each of the top, middle, and bottom portions.

A comparison of the results of Examples 1 and 2 demonstrates the uniform distribution of the phosphor material in the sample which was pre-reacted to suspend the phosphor within the epoxy compound prior to B-staging, as compared with a sample which did not involve such a pre-reaction.

The foregoing examples are intended to illustrate, without limitation, the molding compositions and methods of the present invention. The invention being thus described, it will be evident to those skilled in the art that the same may be varied in many ways. Such variations are not to be regarded as a departure from the spirit and scope of the invention and all such modifications are intended to be included within the scope of the claims.

What is claimed is:

1. A composition of matter comprising a reaction product obtained through partial curing of the following:
   a) an epoxy composition comprising the reaction product of:
      i) an epoxy resin,
      ii) an anhydride component;
   b) a polyol for promoting the reaction of said epoxy component and said anhydride component; and
   c) a visible light-emitting phosphor material, said phosphor material substantially uniformly distributed throughout said composition of matter through initial partial curing of said epoxy composition of component a) to uniformly suspend said phosphor material of component c) therein prior to partial curing of the reaction product of components a), b) and c).

2. A composition as in claim 1, wherein said epoxy resin comprises triglycidyl isocyanurate.

3. A composition as in claim 1, wherein said anhydride component comprises hexahydrophthalic anhydride.

4. A composition as in claim 1, wherein said polyol is selected from the group consisting of glycerol, trimethylol propane, ethylene glycol, diethylene glycol, propylene glycol, dipropylene glycol, and mixtures thereof.

5. A composition as in claim 1, wherein said phosphor material is capable of converting ultraviolet and blue light into visible white light.

6. A composition as in claim 1, wherein said epoxy resin comprises from about 20 weight percent to about 75 weight percent of said composition based on the total weight of the composition.

7. A composition as in claim 1, wherein said anhydride component comprises from about 20 weight percent to about 75 weight percent of said composition based on the total weight of the composition.

8. A composition as in claim 1, wherein said phosphor material comprises from about 0.5 weight percent to about 20 weight percent of said composition based on the total weight of the composition.

9. A composition as in claim 8, wherein said phosphor material comprises from about 5 weight percent to about 12 weight percent of said composition based on the total weight of the composition.

10. A molding compound comprising the composition of claim 1.

11. An encapsulant material for electronic components comprising a molding compound having a weight average molecular weight of about 5,000 to about 20,000, said molding compound comprising a reaction product of a partially cured epoxy composition having a phosphor material substantially uniformly distributed therethrough, wherein said molding compound is prepared by B-staging a partially cured mixture of said epoxy composition and said phosphor material which has been previously subjected to partial curing to increase the viscosity of said epoxy composition and suspend said phosphor material within said epoxy composition during mixing of said mixture.

12. An encapsulant material as in claim 11, wherein said partially cured epoxy composition has a weight average molecular weight of about 400 to about 1,000.

13. An encapsulant material as in claim 11, wherein said epoxy composition comprises the reaction product of an epoxy resin and an anhydride.

* * * * *